United States Patent
Yu et al.

(10) Patent No.: US 9,978,646 B2
(45) Date of Patent: May 22, 2018

(54) INTERCONNECT STRUCTURES AND FABRICATION METHOD THEREOF

(71) Applicants: Semiconductor Manufacturing International (Beijing) Corporation, Beijing (CN); Semiconductor Manufacturing International (Shanghai) Corporation, Shanghai (CN)

(72) Inventors: Yunchu Yu, Shanghai (CN); Yihua Shen, Shanghai (CN)

(73) Assignees: SEMICONDUCTOR MANUFACTURING INTERNATIONAL (BEIJING) CORPORATION, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days. days.

(21) Appl. No.: 15/207,672

(22) Filed: Jul. 12, 2016

(65) Prior Publication Data

US 2017/0011966 A1 Jan. 12, 2017

Related U.S. Application Data

(62) Division of application No. 14/539,285, filed on Nov. 12, 2014, now Pat. No. 9,419,090.

(30) Foreign Application Priority Data

Dec. 5, 2013 (CN) .......................... 2013 1 0652962

(51) Int. Cl.
*H01L 23/52* (2006.01)
*H01L 21/8234* (2006.01)
(Continued)

(52) U.S. Cl.
CPC ............... *H01L 21/823475* (2013.01); *H01L 21/32053* (2013.01); *H01L 21/768* (2013.01);
(Continued)

(58) Field of Classification Search
CPC ........... H01L 21/823871; H01L 27/092; H01L 21/768; H01L 27/088; H01L 21/823475;
(Continued)

(56) References Cited

U.S. PATENT DOCUMENTS 5,987,086 A * 11/1999 Raman ................ G06F 17/5077
716/120
6,538,338 B2 * 3/2003 Kumagai ............ H01L 27/1104
257/213
(Continued)

*Primary Examiner* — Thinh T Nguyen
(74) *Attorney, Agent, or Firm* — Anova Law Group, PLLC

(57) ABSTRACT

An interconnect structure is provided. The interconnect structure includes a substrate; and at least a first interconnect component having a first contact region and a second interconnect component having a second contact region. The interconnect structure also includes an interlayer dielectric layer formed on the semiconductor substrate at a same layer as the first interconnect component and the second interconnect component. Further, the interconnect structure includes an interconnect line layer electrically connecting the first contact region and the second contact region formed inside the interlayer dielectric layer.

12 Claims, 8 Drawing Sheets

(51) Int. Cl.
*H01L 21/768* (2006.01)
*H01L 27/088* (2006.01)
*H01L 21/3205* (2006.01)
*H01L 29/45* (2006.01)
*H01L 21/8238* (2006.01)
*H01L 27/092* (2006.01)
*H01L 29/66* (2006.01)
*H01L 23/528* (2006.01)
*H01L 27/11* (2006.01)
*H01L 21/84* (2006.01)
*H01L 27/108* (2006.01)

(52) U.S. Cl.
CPC .......... *H01L 21/76895* (2013.01); *H01L 21/823481* (2013.01); *H01L 21/823871* (2013.01); *H01L 23/528* (2013.01); *H01L 27/088* (2013.01); *H01L 27/092* (2013.01); *H01L 29/45* (2013.01); *H01L 29/66545* (2013.01); *H01L 21/84* (2013.01); *H01L 27/108* (2013.01); *H01L 27/11* (2013.01); *H01L 27/1108* (2013.01)

(58) Field of Classification Search
CPC .............. H01L 21/32053; H01L 29/45; H01L 29/66545; H01L 21/76895; H01L 21/823481; H01L 23/528; H01L 27/1108; H01L 21/84; H01L 27/108
USPC ......... 257/741, 740, 745, 206.208, E23.141; 438/650, 686, 128
See application file for complete search history.

(56) References Cited

U.S. PATENT DOCUMENTS

| | | | |
|---|---|---|---|
| 6,720,628 B2* | 4/2004 | Karasawa | G11C 11/412 257/377 |
| 6,982,451 B1 | 1/2006 | Voogel et al. | |
| 7,087,493 B1* | 8/2006 | Madan | H01L 27/11 257/369 |
| 2002/0008266 A1* | 1/2002 | Kumagai | H01L 27/11 257/296 |
| 2002/0009002 A1* | 1/2002 | Kumagai | H01L 27/1104 365/200 |
| 2013/0095580 A1* | 4/2013 | Or-Bach | H01L 23/481 438/17 |

* cited by examiner

INTERCONNECT STRUCTURES AND FABRICATION METHOD THEREOF

CROSS-REFERENCES TO RELATED APPLICATIONS

This application is a divisional of U.S. patent application Ser. No. 14/539,285, filed on Nov. 12, 2014, which claims the priority of Chinese patent application No. 201310652962.0, filed on Dec. 5, 2013, the entirety of all of which is incorporated herein by reference.

FIELD OF THE INVENTION

The present invention generally relates to the field of semiconductor technology and, more particularly, relates to interconnect structures and fabrication techniques thereof.

BACKGROUND

Metal interconnect structures are the necessary components of semiconductor devices and integrated circuits (ICs). For example, metal interconnect structures can be used for the interconnections between source/drain regions, between transistors, and/or between the metal lines on different layers, etc. Therefore, the formation of metal interconnect structures significantly affects the performance of semiconductor devices and the production cost during the manufacturing of semiconductor devices.

FIG. 1 illustrates an existing interconnect structure between two transistors. As shown in FIG. 1, in order to achieve the interconnection between the first source region 101a of the first transistor 100a and the second source region 101b of the second source region 100b, a first opening (not shown) and a second opening (not shown) may be formed in the dielectric layer 102. Then, the first conductive via 103a and the second conductive via 103b may be formed in the first opening and the second opening, respectively. Further, a metal interconnect line 104 electrically connecting the first conductive via 103a and the second conductive via 103b may be formed on the surface of the interlayer dielectric layer 102.

However, with further shrinking the technology node, such interconnect structure may become more complex, and the response time of the semiconductor devices may need to be further improved. The disclosed device structures and methods are directed to solve one or more problems set forth above and other problems.

BRIEF SUMMARY OF THE DISCLOSURE

One aspect of the present disclosure includes a method for fabricating a interconnect structure. The method includes providing a substrate; and forming a semiconductor layer having at least a first sub-semiconductor layer and a second sub-semiconductor layer on the substrate. The method also includes forming a first interconnect component having a first contact region and a second interconnect component having a second contact region by performing pre-determined fabrication processes onto the first sub-semiconductor layer, the second sub-semiconductor layer and the substrate. Further, the method includes forming an interlayer dielectric layer on the semiconductor substrate at a same layer as the first interconnect component and the second interconnect component; and forming an interconnect line layer electrically interconnect the first interconnect component and the second interconnect component inside the interlayer dielectric layer.

Another aspect of the present disclosure includes an interconnect structure. The interconnect structure includes a substrate; and at least a first interconnect component having a first contact region and a second interconnect component having a second contact region. The interconnect structure also includes an interlayer dielectric layer formed on the semiconductor at a same layer as the first interconnect component and the second interconnect components. Further, the interconnect structure includes an interconnect line layer electrically connecting the first contact region and the second contact region formed inside the interlayer dielectric layer Other aspects of the present disclosure can be understood by those skilled in the art in light of the description, the claims, and the drawings of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

With the continuous shrinking of the technology node, the integration level of integrated circuits (ICs) has been continuously increased, thus more metal interconnections between transistors in a unit area are needed. The method that forms conductive vias in the interlayer dielectric layers and forms metal lines on the surface of the interlayer dielectric layers may need more interlayer dielectric layers, thus the interconnect structures becomes more complex. For example, more conductive lines and vias may need to be formed. Further, because the signal transmission distances (may also refer to the line distance between two contact pads) are increased, thus the response time of the semiconductor devices may be affected.

During the formation of a transistor, stripe openings may be formed by cutting the poly silicon layer on the surface of the semiconductor substrate, and the poly silicon layer may be divided into a plurality of independent stripe structures. If the stripe openings may be effectively utilized to form metal lines inside, the space of the semiconductor substrate may be effectively used; the signal transmission distance between transistors may be reduced; and the response time of the semiconductor devices may be improved.

Figure 1:
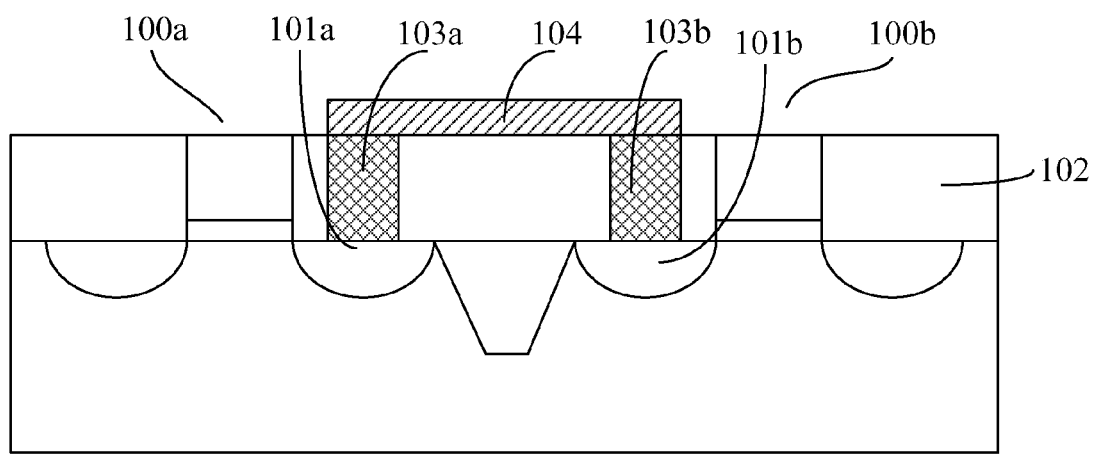
FIG. 1 illustrates an existing interconnect structure.
Figure 2:
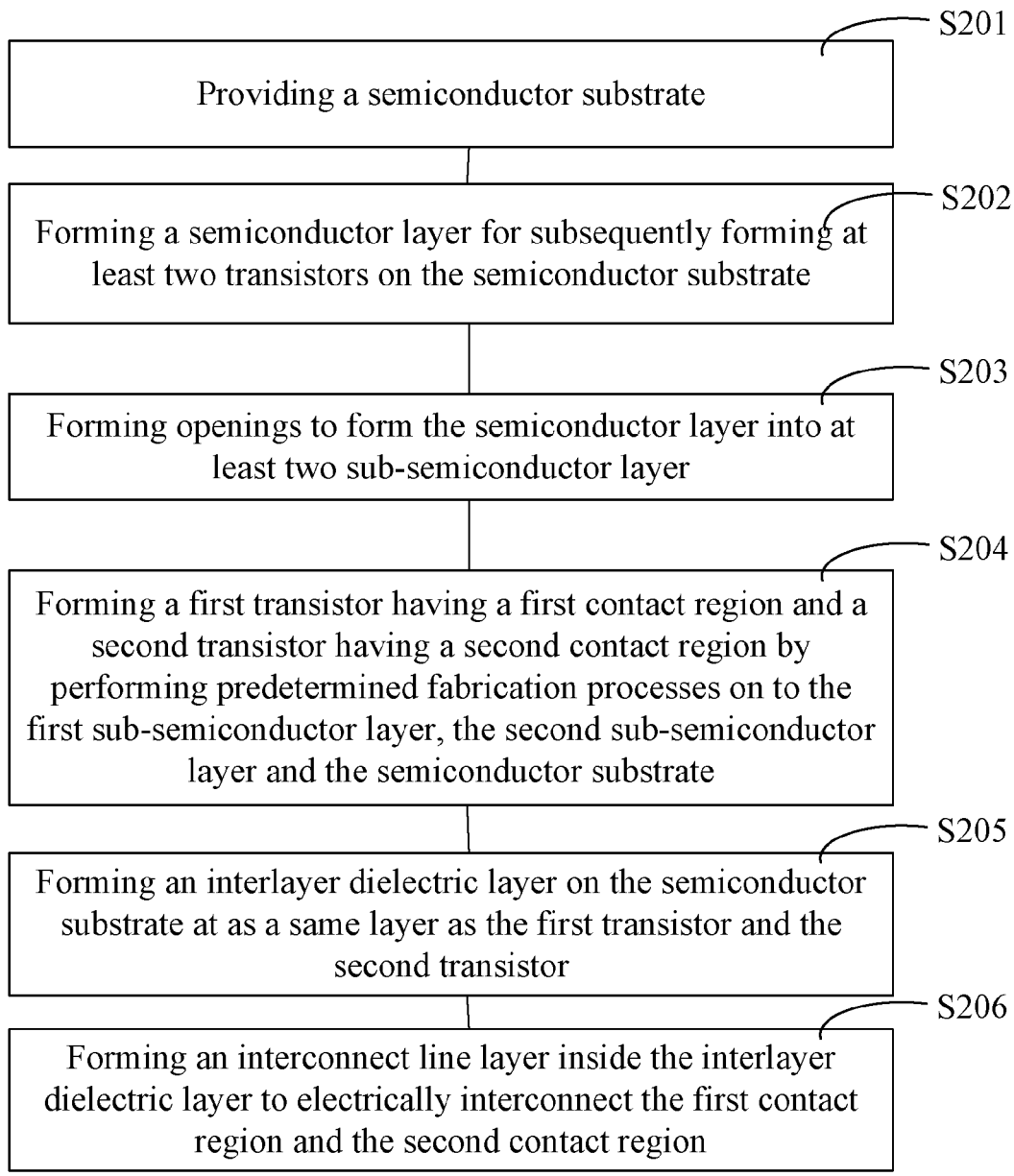
FIG. 2 illustrates an exemplary fabrication process of an interconnect structure consistent with the disclosed embodiments.

FIG. 2 illustrates an exemplary fabrication process of an interconnect structure consistent with the disclosed embodiments; and FIGS. 3~10 illustrate semiconductor structures corresponding certain stage of the fabrication process consistent with the disclosed embodiments.

Figure 3:
FIGS. 3~10 illustrate semiconductor structures corresponding to certain stages of the exemplary fabrication process consistent with the disclosed embodiments.
Figure 4:
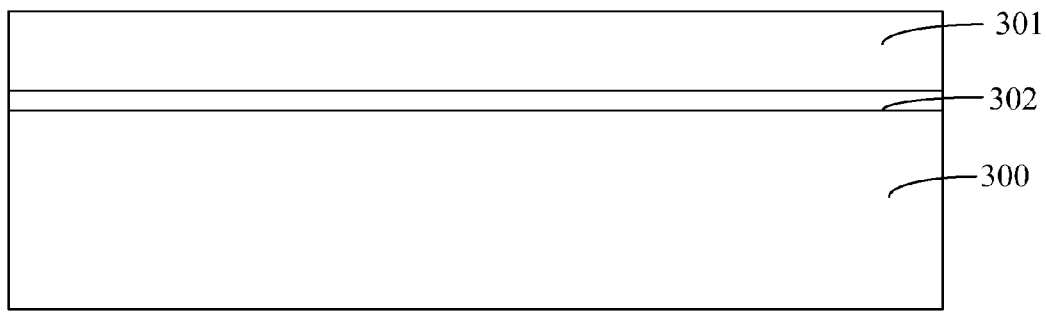

As shown in FIG. 2, at the beginning of the fabrication process, a substrate is provided (S201). FIGS. 3~4 illustrate a corresponding semiconductor structure. FIG. 4 illustrates a cross-section view of the semiconductor structure shown in FIG. 3.

As shown in FIGS. 3~4, a substrate 300 is provided. The substrate 300 provides a base for subsequent processes and devices. The substrate 300 may be a semiconductor substrate including silicon, silicon on insulator (SOI), germanium on insulator (GOI), silicon germanium, carborundum, indium antimonide, lead telluride, indium arsenide, indium phosphide, gallium arsenidie, gallium antimonite, or alloy semiconductor. The substrate 300 may also be glass, or ceramic, etc. In one embodiment, the substrate 300 is silicon. A gate oxide layer 302 may be formed on the substrate 300.

Returning to FIG. 2, after providing the semiconductor substrate 300, a semiconductor layer may be formed (S202). FIGS. 3~4 illustrate a corresponding semiconductor structure. FIG. 4 illustrates a cross-section view of the semiconductor structure shown in FIG. 3.

As shown in FIGS. 3~4, a semiconductor layer 301 is formed on the substrate 300. In one embodiment, if the substrate 300 is made of silicon, the gate oxide layer 302 is formed between the silicon substrate 300 and the semiconductor layer 301. The gate oxide layer 302 may be configured as a gate oxide layer of subsequently formed transistors.

The semiconductor layer 301 may be used to form transistors. In one embodiment, at least two transistors are formed in the semiconductor layer 301. The semiconductor layer 301 may be made of any appropriate semiconductor material, such as silicon, germanium, carborundum, indium antimonide, lead telluride, indium arsenide, indium phosphide, gallium arsenidie, gallium antimonite, or alloy semiconductor. In one embodiment, the semiconductor layer 301 is made of poly silicon.

Various processes may be used to form the semiconductor layer 301, such as a chemical vapor deposition (CVD) process, a physical vapor deposition (PVD) process, or a sputtering process, etc.

Figure 5:
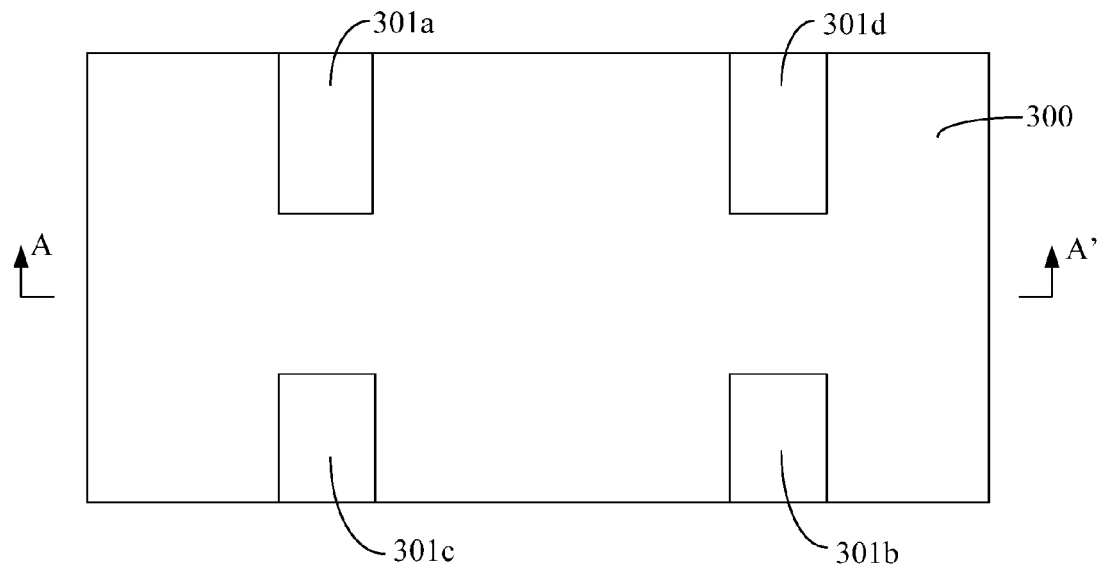
Figure 6:
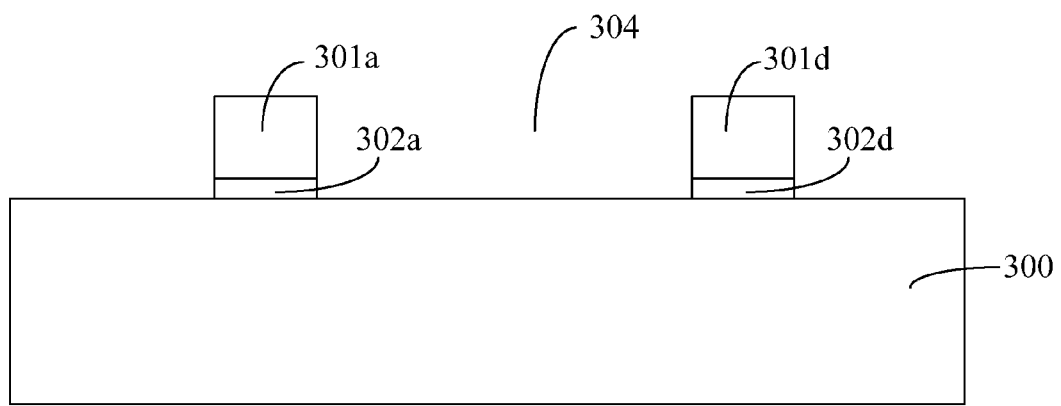

Returning to FIG. 2, after forming the semiconductor layer 301, openings 304 may be formed in the semiconductor layer 301 (S203). FIGS. 5~6 illustrate a corresponding semiconductor structure; and FIG. 6 is a cross-section view of the semiconductor structure illustrated in FIG. 5 along the AA' direction.

As shown in FIGS. 5~6, openings 304 are formed in the semiconductor layer 301. The openings 304 may be through the semiconductor layer 301; and the semiconductor layer 301 may be formed into at least two sub-semiconductor layers. In one embodiment, the semiconductor layer 301 is formed into a first sub-semiconductor layer 301a and a second sub-semiconductor layer 301b separated by the openings 304. In certain other embodiments, the number of the sub-semiconductor layers may be greater than two. The sub-semiconductor layers may be used to subsequently form transistors. Referring to FIGS. 5~6, four sub-semiconductor layers are formed: they are the first sub-semiconductor layer 301a, the second sub-semiconductor layer 301b, the third sub-semiconductor layer 301c and the fourth sub-semiconductor layer 301d.

Further, as shown in FIG. 6, if there is a gate oxide layer 302 between the substrate 300 and the semiconductor layer 301, the gate oxide layer 302 may also be formed into a plurality of sub-gate oxide layers. In one embodiment, the gate oxide layer 302 is formed into, a first gate oxide layer 302a, a second gate oxide layer 302b (not shown), a third gate oxide layer 302c (not shown) and a fourth gate oxide layer 302d.

The openings 304 may be formed by any appropriate process, such as a dry etching process, a wet etching process, an ion beam etching process or a cutting process, etc. In one embodiment, considering the number of the openings 304 may be relatively large, a cutting process is used to form the openings 304 to form the sub-semiconductor layers. Specifically, stripe-shape sub-semiconductor layers (not shown) may be formed by cutting the semiconductor layer 301 along a first direction; and followed by cutting the stripe-shape sub-semiconductor layers along a second direction with a pre-determined angle to the first direction. Thus, a plurality of the sub-semiconductor layers may be formed. The pre-determined angle may be approximately 90°, or other appropriate angles.

For illustrative purposes, four semiconductor layers are used in the description: they are the first sub-semiconductor layer 301a, the second sub-semiconductor layer 301b, the third sub-semiconductor layer 301c and the forth sub-semiconductor layer 301d. Since the sub-semiconductor layers may be used to subsequently form transistors, when the semiconductor layer 301 is cut, the gate oxide layer 302 may be also be correspondingly cut into the first gate oxide layer 302a, the second gate oxide layer 302b, the third gate oxide layer 302c and the fourth gate oxide layer 302d.

Figure 7:
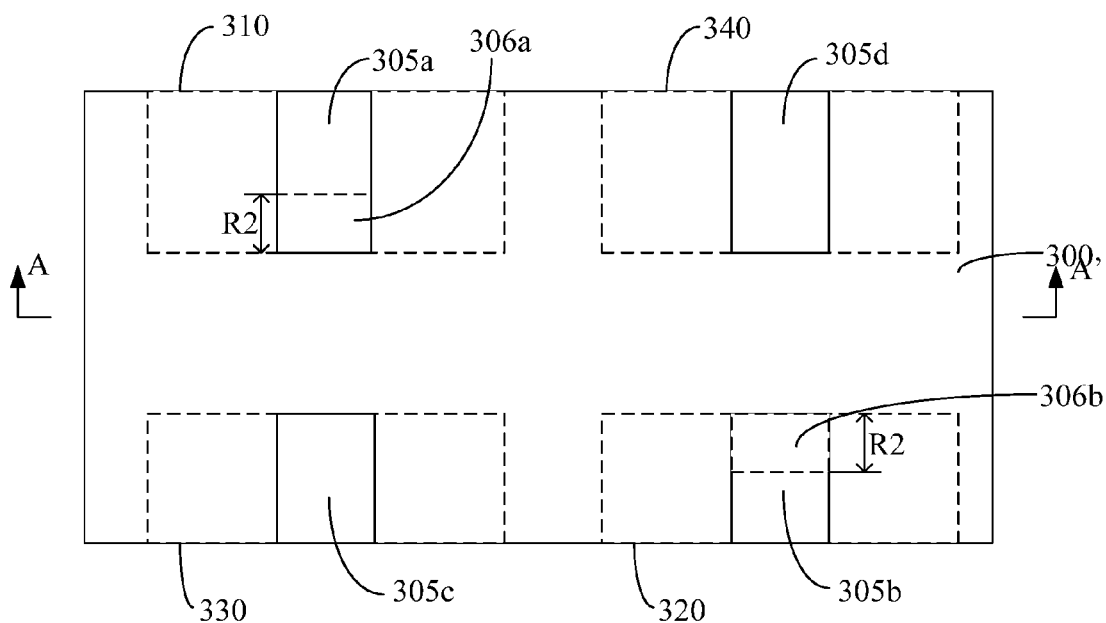
Figure 8:
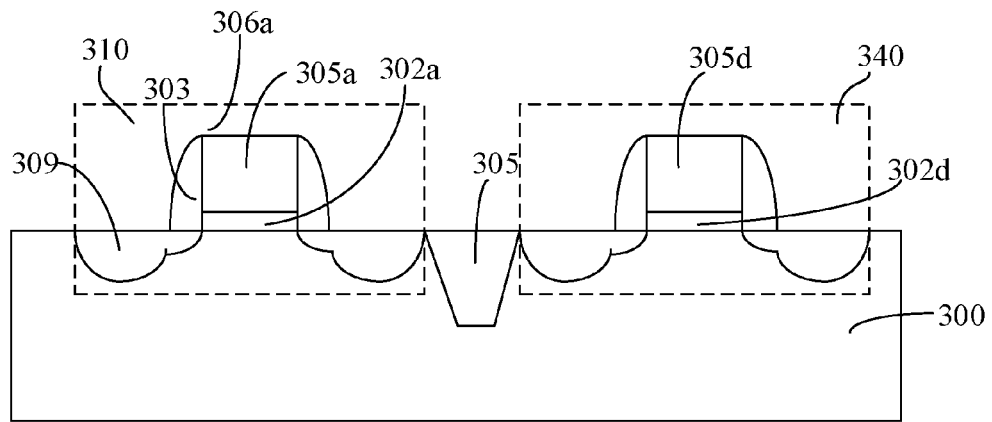

Returning to FIG. 2, after forming the openings 304 and the plurality of sub-semiconductor layers, transistors may be formed (S204). FIGS. 7~8 illustrate a corresponding semiconductor structure; and FIG. 8 is a cross-section view of the semiconductor structure illustrated in FIG. 7 along the AA' direction.

As shown in FIGS. 7~8, transistors are formed. The transistors are formed with the sub-semiconductor layers and the portion of the substrate 300 under the sub-semiconductor layers by appropriate processes. The transistors may be subsequently interconnected by the interconnect structure, thus they may be referred as interconnect components. In certain other embodiments, the interconnect components may be interconnect lines, etc.

For illustrative purposes, as shown in FIGS. 7~8, four transistors are formed and used for the description: they are the first transistor 310, the second transistor 320, the third transistor 330 and the fourth transistor 340. All the four transistors may be connected by interconnection structures. In one embodiment, for illustrative purposes, an interconnection between the gate of the first transistor 310 and the gate of the section transistor 320 are used the description. That is, at least two interconnect components are used for the description.

The transistors may be formed by performing certain fabrication processes to the sub-semiconductor layers and the substrate 300. Specifically, a process for forming transistors may include forming sidewall spacers on the side surfaces of the sub-semiconductor layers and the sub-gate electrode layers; followed by doping the semiconductor substrate 300 using the sidewall spacers as a mask to form source regions and drain regions.

Referring to FIG. 7 and the FIG. 8, for illustrative purposes, the first transistor 310 and the fourth transistor 340 are shown. In one embodiment, the first transistor 310 and the fourth transistor 340 have the source/drain regions 309 and the sidewall spacers 303. Further, as shown in FIGS. 7-8, the transistors 310-340 may be metal gate transistors, and the first sub-semiconductor layer 301a, the second sub-semiconductor layer 301b, the third sub-semiconductor layer 301c and the fourth sub-semiconductor layer 301d may be substituted by a first metal gate electrode layer 305a, a second metal gate electrode layer 305b, a third metal gate electrode layer 305c and a fourth metal gate electrode layer 305d, correspondingly. The first transistor 310, the second transistor 320, the third transistor 330 and the fourth transistor 340 may have better performance when the metal gate electrode layers are used.

The sidewall spacers 303 may be made of any appropriate material, such as one or more of silicon oxide, silicon nitride, or silicon oxynitride, etc. Various processes may be used to form the sidewall spacers 303, such as an etch back process, etc.

The metal gate electrode layers may be made of any appropriate material, such as copper, aluminum, or gold, etc. The metal gate electrode layers may be formed by a gate-last process. Specifically, after forming the sidewall spacers 303, the sub-semiconductor layers may be removed; and the metal gate electrode layers may be deposited on the sub-gate oxide layers.

Further, as shown in FIGS. 7-8, because the gate of the first transistor 310 and the gate of the second transistor 320 may be electrically connected, a portion of the surface of the first metal gate electrode layer 305a may be configured as a first contact region 306a; and a portion of the surface of the second metal gate electrode layer 305b may be configured as a second contact region 306b. In order to ensure the first transistor 310 and the second transistor 320 to have a reliable signal transformation, referring to FIG. 7, the overlap distance between the first contact region 306a and the to-be-connected component of the first transistor 310, such as the first metal gate electrode layer 305a, etc., may be at least a second distance $R_2$. Similarly, the overlap distance between the second contact region 306b and the to-be-connected component of the first transistor 320, such as the second gate electrode layer 305b, etc., may be the second safe distance $R_2$ as well. In one embodiment, the to-be-connected components are the first metal gate electrode layer 305a and the second gate electrode layer 305b, the second safe distance $R_2$ may be at least in a range of approximately 40 nm-50 nm.

In certain other embodiments, the first contact region 306a may be the source region, the drain region, or a portion of the gate of the first transistor 310. The second contact region 306b may be the source region, the drain region or the portion of the gate of the second transistor 302.

In certain other embodiments, if the first sub-semiconductor layer 301a and the second sub-semiconductor layer 302a are directly configured as the gate of the first transistor 310 and the second transistor 320, in order to reduce the resistance between the first transistor 310 and the subsequently formed interconnect line layer and the resistance between the second transistor 320 and the subsequently formed interconnect line layer, a first contact layer (not shown) may be formed on the first contact region 306a; and a second contact layer (not shown) may be formed on the second contact region 306b. The first contact layer and the second contact layer may be formed after forming the transistors and before forming a subsequently formed interlayer dielectric layer. The first contact layer and the second layer may also be formed after forming the interlayer dielectric layer.

The first contact layer and the second contact layer may be made of any appropriate material, such as metal material, or metal silicide, etc. In one embodiment, the first contact layer and the second contact layer are made of metal silicide. The metal silicide may be formed by depositing a metal layer on the first semiconductor layer 301a and the second semiconductor layer 301b; and followed by a thermal annealing process in a protection gas.

Figure 9:
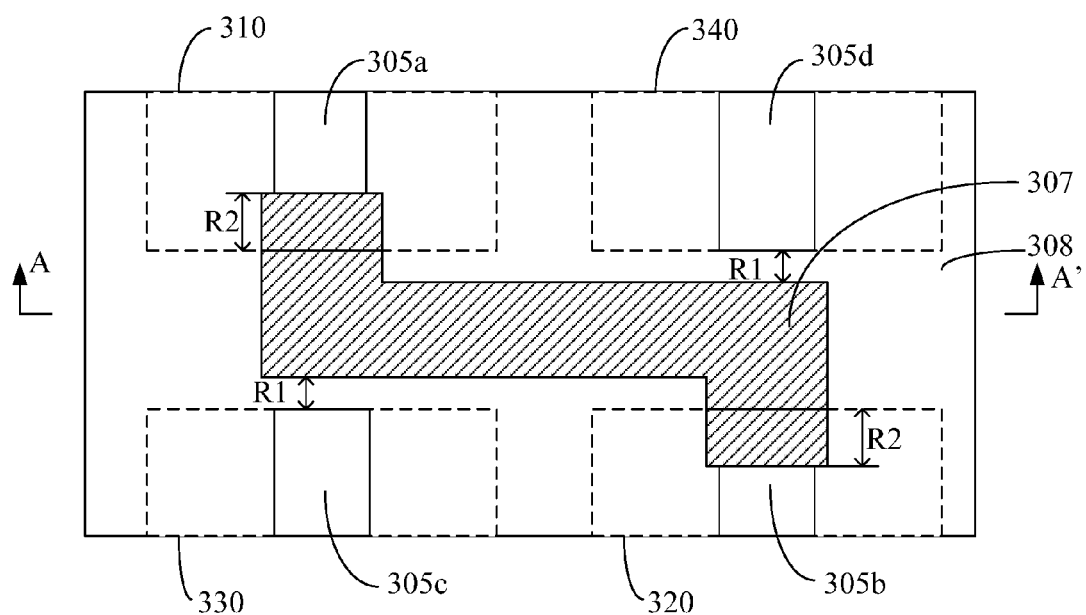
Figure 10:
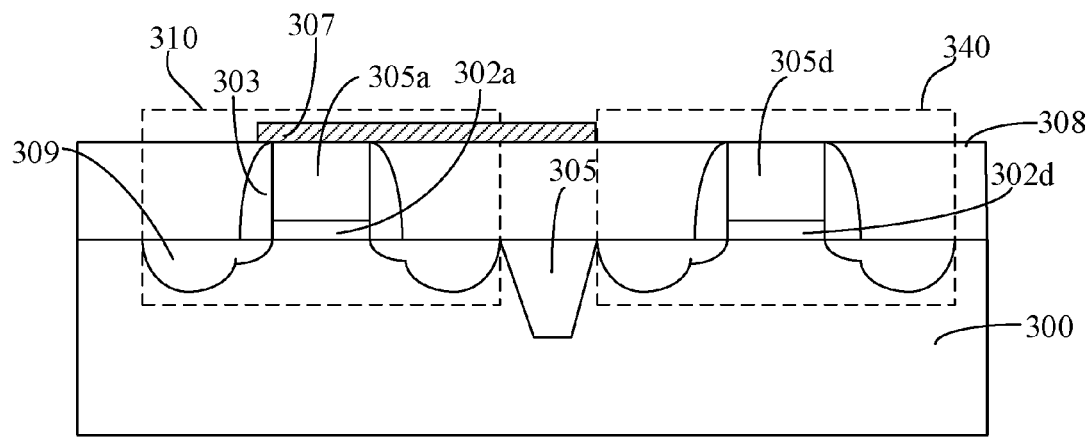

Returning to FIG. 2, after forming the first transistor 310 and the second transistors 320, an interlayer dielectric layer may be formed (S204). FIGS. 9~10 illustrate a corresponding semiconductor structure; and FIG. 10 is a cross-section view of the semiconductor structure illustrated in FIG. 9.

As shown in FIGS. 9~10, an interlayer dielectric layer 308 is formed on the substrate 300. The interlayer dielectric layer 308 may be at a same layer as the first transistor 310 and the second transistor 320. The interlayer dielectric layer 308 may be used to isolate adjacent transistors.

In one embodiment, the surface of the interlayer dielectric layer 308 levels with the top surface of at least one of the first transistor 310 and the second transistor 320. In certain other embodiments, the surface of the interlayer dielectric layer 308 may be slightly lower than the top surface of the first transistor 310 and the second transistor 320. Such a configuration may aid to subsequently form an interconnect line layer in the interlayer dielectric layer 308.

Further, referring to FIGS. 9-10, when the surface of the interlayer dielectric layer 308 levels with the first transistor 310 and the second transistor 320; or is lower than the first transistor 310 and the second transistor 320, the interlayer dielectric layer 308 may be formed in the openings 304 between the transistors. That is, the interlayer dielectric layer 308 is formed in the openings 304 formed by the cutting process. An interconnect line layer may be subsequently formed inside the interlayer dielectric layer 308, thus the interconnect metal line may be formed in the openings 304. Therefore, the space of the substrate 300 may be effectively utilized; the signal transmission distance may be reduced; and the signal response time of the semiconductor devices may be improved. In some embodiments, openings 304 are stripe-shaped.

The interlayer dielectric layer 308 may be made of any appropriate material, such as silicon oxide, silicon nitride, silicon oxynitride, etc. Various processes may be used to form the interlayer dielectric layer 308, such as a CVD process, a PVD process, or a flowable CVD process, etc.

Returning to FIG. 3, after forming the interlayer dielectric layer 308, an interconnect line layer may be formed in the interlayer dielectric layer 308 (S205). FIGS. 9~10 illustrate a corresponding semiconductor structure; and FIG. 10 is a cross-section view of the semiconductor structure illustrated in FIG. 9.

As shown in FIGS. 9~10, an interconnect line layer 307 is formed in the interlayer dielectric layer 308. The interconnect line layer 307 may connect both the first contact region 306a and the second contact region 306b, thus an electrical interconnection between the first transistor 310 and the second transistor 320 may be formed.

A process for forming the interconnect line layer 307 in the interlayer dielectric layer 308 may include forming a trench (not shown) in the interlayer dielectric layer 308 by etching the interlayer dielectric layer 308; and followed by filling the trench with a conductive material. Thus, the interconnect line layer 307 may be formed. The trench may used to form the interconnect line layer 307, in order to ensure the interconnect line layer 307 to electrically contact with the first transistor 310 and the second transistor 320, the first contact region 306a and the second contact region 306b may be exposed at both ends of the trench. Further, the bottom of the trench may level with the top surface of the first contact region 306a and the second contact region 306b; or may be lower than the first contact region 306a and the second contact region 306b. Such a configuration of the trench may aid the interconnect line layer 307 to have a better connection with the first contact region 306a and the second contact region 306b.

Further, referring to FIG. 9, after forming the interconnect line layer 307, in order to avoid an effect of the interconnect line layer 307 to the adjacent transistors which are not required to be interconnected, such as the third transistor 330 or the fourth transistor 340, etc., the distance between the interconnection line layer 307 and the adjacent transistors which are not required to be connected may be at least a first safe distance $R_1$. The first safe distance $R_1$ may be a minimum distance within which the interconnect line layer 307 will not affect the adjacent transistors which are not required to be interconnected. In one embodiment, the first safe distance $R_1$ may be in a range of approximately at least 20 nm-30 nm.

The interconnect line layer 307 may be made of any appropriate material, such as Cu, Al, or Ti, etc. In one embodiment, the interconnect line layer 307 is made of Cu.

Various processes may be used to form the interconnect layer 307, such as a PVD process, a CVD process, a sputtering process, or an electroplating process, etc.

Referring to FIGS. 9~10, because the interconnect line layer 307 is formed inside the interlayer dielectric layer 308 between the first transistor 310 and the second transistor 320, the signal transformation distance may be effectively shortened. Further, because the interconnect line layer 307 is formed in the interlayer dielectric layer 308; and directly contact with the first contact region 305a and the second contact region 305b, no redundant conducting lines and structures are needed to achieved an interconnection, the structure of the interconnect structure may be simplified; and the routing density of the electrical interconnection levels may be increased. Further, the response time of semiconductor devices may be improved because the signal transmission distance is reduced.

Thus, an interconnect structure may be formed by the above disclosed processes and methods; and a corresponding interconnect structure is illustrated in FIGS. 9~10. The interconnect structure includes a substrate 300; and at least a first transistor 310 having a first contact region 306a configured on a portion of the gate of the first transistor 310 and a second transistor 320 having a second contact region 306b configured on a portion of the gate of the second transistor 320. The interconnect structure also includes an interlayer dielectric layer 308 formed on a same layer as the first transistor 310 and the second transistor 320; and an interconnect line layer 307 formed inside the interlayer dielectric layer 308 electrically connecting with the first contact region 306a and the second contact region 306b. The detailed structures and intermediate structures are described above with respect to the fabrication processes.

FIGS. 11~14 illustrate another exemplary fabrication of an interconnect structure consistent with the disclosed embodiments.

Figure 11:
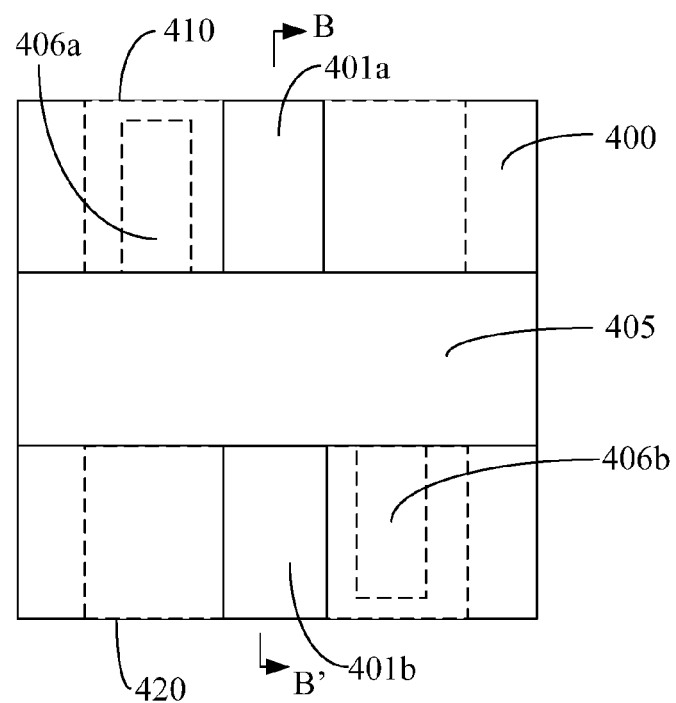
FIGS. 11~14 illustrate semiconductor structures corresponding to certain stages of another exemplary fabrication process consistent with the disclosed embodiments.
Figure 12:
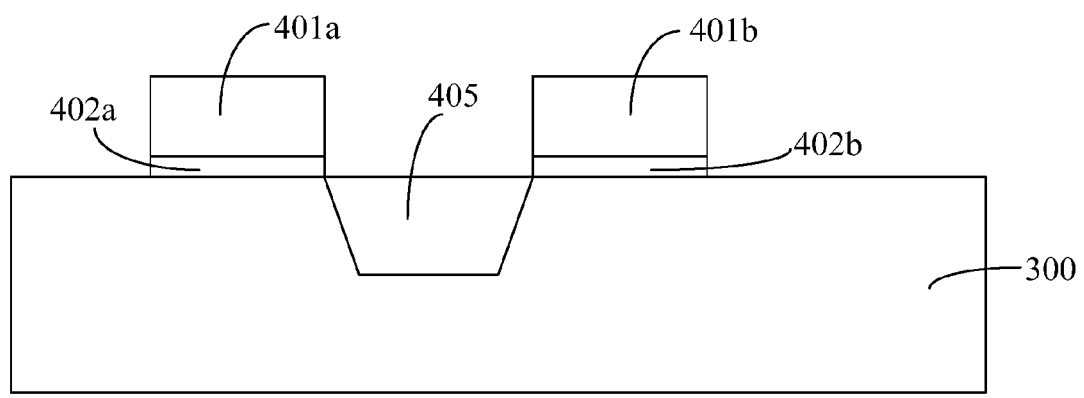

As shown in FIGS. 11-12, at the beginning of the fabrication process, a substrate is provided (S201). FIGS. 11~12 illustrate a corresponding semiconductor structure. FIG. 12 illustrates a cross-section view of the semiconductor structure shown in FIG. 11 along the BB' direction.

As shown in FIGS. 11~12, a substrate 400 is provided. The substrate 400 provides a base for subsequent processes and devices. The substrate 400 may be a semiconductor substrate including silicon, silicon on insulator (SOI), germanium on insulator (GOI), silicon germanium, carborundum, indium antimonide, lead telluride, indium arsenide, indium phosphide, gallium arsenidie, gallium antimonite, or alloy semiconductor. The substrate 400 may also be glass, or ceramic, etc. In one embodiment, the substrate 400 is silicon.

Further, after providing the substrate 400, a semiconductor layer may be formed. FIGS. 11~12 illustrate a corresponding semiconductor structure. FIG. 12 illustrates a cross-section view of the semiconductor structure shown in FIG. 11.

As shown in FIGS. 11~12, a semiconductor layer (not labeled) is formed on the substrate 400. In one embodiment, if the substrate 400 is made of silicon, a gate oxide layer (not labeled) is formed between the silicon substrate 400 and the semiconductor layer. The semiconductor layer may be used to subsequently form sub-semiconductor layers for forming transistors. Some of the transistors may be referred as interconnected components for being interconnected by the interconnect structure. The gate oxide layer may be configured as a gate oxide layer of subsequently formed transistors.

The semiconductor layer may be used to form transistors. In one embodiment, at least two transistors are formed in the semiconductor layer. The semiconductor layer may be made of any appropriate semiconductor material, such as silicon, germanium, carborundum, indium antimonide, lead telluride, indium arsenide, indium phosphide, gallium arsenidie, gallium antimonite, or alloy semiconductor. In one embodiment, the semiconductor layer is made of poly silicon.

Various processes may be used to form the semiconductor layer, such as a chemical vapor deposition (CVD) process, a physical vapor deposition (PVD) process, or a sputtering process, etc.

As shown in FIGS. 11~12, after forming the semiconductor layer, the semiconductor layer may be formed into at least at two sub-semiconductor layers. FIGS. 11~12 illustrate a corresponding semiconductor structure; and FIG. 12 is a cross-section view of the semiconductor structure illustrated in FIG. 11 along the BB' direction.

As shown in FIGS. 11~12, the semiconductor layer is formed into at least two sub-semiconductor layers. In one embodiment, the semiconductor layer is formed into a first sub-semiconductor layer 401a and a second sub-semiconductor layer 401b. In certain other embodiments, the number of the sub-semiconductor layers may be greater than two. The sub-semiconductor layers may be used to subsequently form transistors.

Various processes may be used to form the sub-semiconductor layers, such as a dry etching process, a wet etching process, or a cutting process, etc. In one embodiment, the sub-semiconductor layers are formed by cutting a plurality of openings (not shown) in the semiconductor layer Further, as shown in FIG. 12, if there is a gate oxide layer between the substrate 400 and the semiconductor layer, the gate oxide layer may also be formed into a plurality of sub-gate oxide layers. In one embodiment, the gate oxide layer is formed into a first gate oxide layer 402a and a second gate oxide layer 402b.

Further, as shown in FIG. 11, a first transistor 410 and the second transistor 420 may be formed (S204). The first transistor 410 and the second transistor 420 may be formed by performing certain fabrication processes onto the first sub-semiconductor layer 401a, the second sub-semiconductor layer 401b and the semiconductor substrate 400. The first transistor 410 may have a first contact region 406a; and the second transistor 420 may have a second contact region 406b.

The first semiconductor layer 401a and the second semiconductor layer 402b may be used to form the first transistor 410 and the second transistor 420, respectively. The source/drain regions of the first transistor 410 and the second transistor 420 may be in the semiconductor substrate 400 at both sides of the first sub-semiconductor layer 401a and the second sub-semiconductor layer 402b, respectively. In one embodiment, the first contact region 406a may be the source region of the first transistor 410; and the second contact region 406b may be the drain region of the second transistor 420. The first contact region 406a and the second contact region 406b may be subsequently interconnected by the interconnect structure.

In certain other embodiments, the first sub-semiconductor layer 401a and the second sub-semiconductor layer 402a may be substituted by a first metal gate electrode layer and a second metal gate electrode layer. The substitution may enhance the performance of the transistors and/or the interconnect structures.

Further, referring to FIG. 12, a shallow trench isolation (STI) structure 405 may be formed in the semiconductor substrate 400. The STI structure 405 may be used to isolate the first transistor 410 and the second transistor 420.

Figure 13:
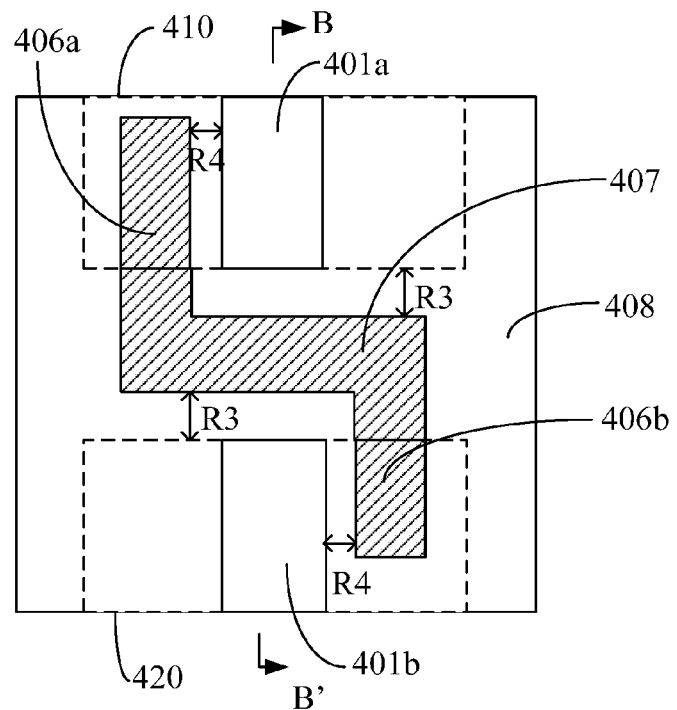
Figure 14:
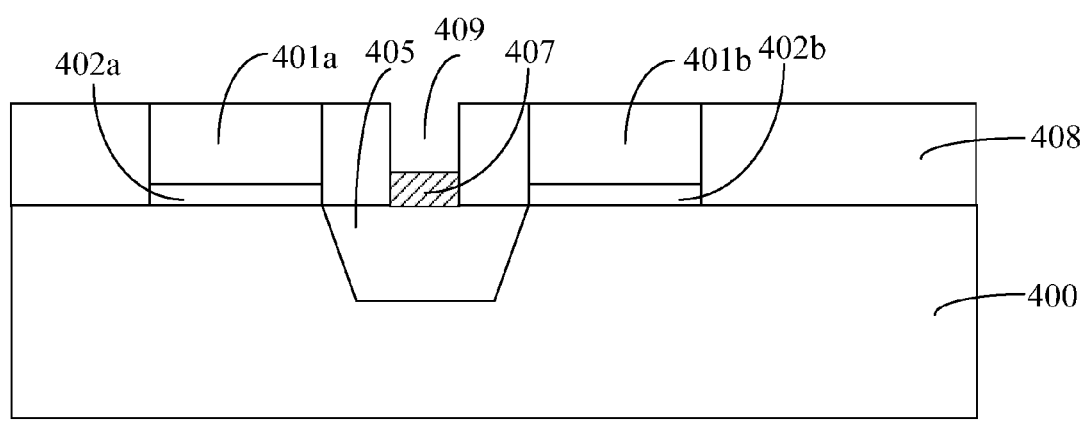

After forming the first transistors 410 and the second transistors 420, an interlayer dielectric layer may be formed. FIGS. 13~14 illustrate a corresponding semiconductor structure; and FIG. 14 is a cross-section view of the semiconductor structure illustrated in FIG. 13.

As shown in FIGS. 13~14, an interlayer dielectric layer 408 is formed between the first transistor 410 and the second transistor 420. The interlayer dielectric layer 408 may be at a same layer as the first transistor 410 and the second transistor 420. In one embodiment, the interlayer dielectric layer 408 may level with the first transistor 410 and the second transistor 420. That is, as shown in FIG. 14, the top surface of the interlayer dielectric layer 408 may level with the top surface of the first sub-semiconductor layer 401a and the top surface of the second sub-semiconductor layer 401b.

Further, as shown in FIGS. 13~14, an interconnect line layer 407 may be formed in the interlayer dielectric layer 408. A process for forming the interconnect line layer 407 in the interlayer dielectric layer 408 may include forming a trench 409 in the interlayer dielectric layer 408 by etching the interlayer dielectric layer 408; and followed by filling the trench 409 with a conductive material. Thus, the interconnect line layer 407 may be formed. The trench 409 is used to form the interconnect line layer 407, in order to ensure the interconnect line layer 407 to electrically contact with the first transistor 410 and the second transistor 420, the first contact region 406a and the second contact region 406b may be exposed at both ends of the trench 409.

Further, the bottom of the trench 409 may level with the top surface of the first contact region 406a and the second contact region 406b, or may be lower than the first contact region 406a and the second contact region 406b. Such a configuration of the trench 409 may aid the interconnect line layer 407 to have a better electrical connection with the first contact region 406a and the second contact region 406b. In one embodiment, the bottom of the trench 409 levels with the surface of the semiconductor substrate 400. That is, the surface of the STI structure 405 may be exposed.

Further, referring to FIG. 13, after forming the interconnect line layer 407, in order to avoid an effect of the interconnect line layer 307 to the adjacent transistors and structures which are not required to be interconnected, the distance between the interconnection line layer 407 and the adjacent transistors which are not required to be connected may be at least a third safe distance $R_3$. The third safe distance $R_3$ may be a minimum distance within which the interconnect line layer 407 will not affect the adjacent transistors and structures which are not required to be interconnected. In one embodiment, the third safe distance $R_3$ may be at least in a range of approximately 40 nm~50 nm. Further, in order to avoid the effect of fabrication processes, the distance between the trench 409 and the side surface of the first transistor 410 and the side surface of the second transistor 420 may be configured as a fourth safe distance $R_4$.

Referring to FIG. 14, the top surface of the interconnect line layer 407 may be lower than the top surface of the interlayer dielectric layer 408; or may level with the top surface of the interlayer dielectric layer 408. Since the trench 409 may expose the surface of the first contact region 406a and the second contact region 406b, portions of the interconnect line layer 407 at both ends may be deposited on the surface of the source region of the first transistor 410 and the surface of the drain region of the second transistor 420 directly, thus the first transistor 410 and the second transistor 420 may be electrically interconnected without other conducting lines or vias, etc. In one embodiment, in order to reduce the total thickness of interconnect structures, the top surface of the interconnect line layer 407 is lower than the top surface of the interlayer dielectric layer 408.

The interconnect line layer 407 may be made of any appropriate material, such as Cu, Al, or Ti, etc. In one embodiment, the interconnect line layer 407 is made of Cu. Various processes may be used to form the interconnect line layer 407, such as a PVD process, a CVD process, a sputtering process, or an electroplating process, etc.

In certain other embodiments, before forming the interconnect line layer 407, a first contact layer (not shown) and a second contact layer (not shown) may be formed on the first contact region 406a and the second contact regions 407b, respectively. The contact layer may be made of metal silicide; and may be used to reduce the contact resistance between the interconnect line layer 407 and the source region of the first transistor 410 and the drain region of the second transistor 420.

The first contact layer and the second contact layer may be made of any appropriate material. In one embodiment, the first contact layer and the second contact layer are made of a same material. The first contact layer and the second contact layer may cover the entire bottom of the trench 409, thus it may not only reduce the contact resistance; and it may also simplify the fabrication steps.

In one embodiment, after forming the interconnect line layer 407, an insulation layer (not shown) may be formed in the trench 409. The surface of the insulation layer may level with the top surface of the interlayer dielectric layer 408.

The insulation layer may be made of any appropriate material. In one embodiment, the insulation layer is made of a material same as the interlayer dielectric layer 408. Various processes may be used to form the insulation layer, such as a CVD process, a PVD process, or a flowable CVD process, etc.

Referring to FIGS. 13~14, because the interconnect line layer 407 may be formed inside the interlayer dielectric layer 408 between the first transistor 410 and the second transistor 420, that is, the interconnect line layer 407 may be formed inside the openings formed by the cutting process for forming the sub-semiconductor layers, the space of the substrate 400 may be effectively utilized. Further, the interconnect layer 407 may be formed on the first contact region 406a and the second contact region 406b directly; no redundant conducting lines and/or conductive vias may need to achieve an electrical interconnection, the routing density of the electrical interconnection levels may be increased. Further, because the length of the interconnect lines may be reduced, the signal transformation distance between the first transistor 410 and the second transistor 420 may be effectively shortened; and the structure of the interconnect layer may be simplified. Further, the total height of the interconnection structures may be reduced. Thus, the complexity of the interconnection structures may be reduced, and the response time of semiconductor devices may be improved.

Thus, an interconnect structure may be formed by the above disclosed processes and methods; and a corresponding interconnect structure is illustrated in FIGS. 13~14. The interconnect structure includes a substrate 400; and a first transistor 410 having a first contact region 406a configured on a portion of a source region of the first transistor 410 and a second transistor 420 having a second contact region 406b configured on a portion of a drain region of the second transistor 420. The interconnect structure also includes an interlayer dielectric layer 408 formed on a same layer as the first transistor 410 and the second transistor 420; and an interconnect line layer 407 formed inside the interlayer dielectric layer 408 electrically connecting with the first contact region 406a and the second contact region 406b. The detailed structures and intermediate structures are described above with respect to the fabrication processes.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. An interconnect structure, comprising:
   a substrate;
   a semiconductor layer having at least a first sub-semiconductor layer and a second sub-semiconductor layer on the substrate;
   a first interconnect component having a first contact region on the first sub-semiconductor layer and a second interconnect component having a second interconnect region formed on the second sub-semiconductor layer on the substrate;
   an interlayer dielectric layer between the first interconnect component and the second interconnect component, wherein a top surface of the interlayer dielectric layer is coplanar with a top surface of the first interconnect component and a top surface of the second interconnect component; and
   an interconnect line layer, electrically connecting with a first contact region and a second contact region to realize an electrical interconnection between the first interconnect component and the second interconnect component, the interconnect line layer being formed inside the interlayer dielectric layer.

2. The interconnect structure according to claim 1, wherein:
   the first interconnect component is a first transistor or a first interconnect line; and
   the second interconnect component is a second transistor or a second interconnect line.

3. The interconnect structure according to claim 2, wherein:
   an overlap distance between the first contact region and an interconnect component of the first transistor has at least a second distance; and
   an overlap distance between the second contact region and an interconnect component of the second transistor has at least the second distance.

4. The interconnect structure according to claim 2, wherein:
   the first contact region is a gate of the first transistor; and
   the second contact region is a gate of the second transistor.

5. The interconnect structure according to claim 2, wherein:
   the first contact region is a source region of the first transistor; and
   the second contact region is a drain region of the second transistor.

6. The interconnect structure according to claim 1, wherein:
   a distance between the trench and adjacent transistor which are not required to be interconnected has at least a first distance.

7. The interconnect structure according to claim 5, wherein:
   the first contact region and the second contact region are made of metal silicide.

8. The interconnect structure according to claim 2, wherein:
   the first transistor and the second transistor have the first sub-semiconductor layer and the second sub-semiconductor layer, respectively; and
   the first sub-semiconductor layer and the second sub-semiconductor layer are separated by an opening formed by cutting a semiconductor layer formed on the substrate, wherein the interlayer dielectric layer is formed in the opening.

9. The interconnect structure according to claim 6, wherein:
   the first distance is at least 20 nm.

10. The interconnect structure according to claim 3, wherein:
    the second distance is at least 40 nm.

11. The interconnect structure according to claim 1, wherein:
    the first contact region is a source region, a drain region, or a portion of a gate of the first transistor; and
    the second contact region of is a source region, a drain region, or a portion of a gate of the second transistor.

12. The interconnect structure according to claim 1, wherein:
    a bottom of the interconnect line layer is coplanar with the top surface of the first interconnect component and the top surface of the second interconnect component.

* * * * *